United States Patent
Pfeuffer

(10) Patent No.: US 9,397,268 B2
(45) Date of Patent: Jul. 19, 2016

(54) OPTOELECTRONIC SEMICONDUCTOR COMPONENT AND METHOD FOR PRODUCING A MIRROR REGION ON A SEMICONDUCTOR BODY

(71) Applicant: OSRAM Opto Semiconductors GmbH, Regensburg (DE)

(72) Inventor: Alexander F. Pfeuffer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/420,883

(22) PCT Filed: Aug. 1, 2013

(86) PCT No.: PCT/EP2013/066230
§ 371 (c)(1),
(2) Date: Feb. 10, 2015

(87) PCT Pub. No.: WO2014/023648
PCT Pub. Date: Feb. 13, 2014

(65) Prior Publication Data
US 2015/0243850 A1    Aug. 27, 2015

(30) Foreign Application Priority Data

Aug. 10, 2012    (DE) .......... 10 2012 107 384

(51) Int. Cl.
*H01L 33/46*    (2010.01)
*H01L 31/0232*    (2014.01)
(Continued)

(52) U.S. Cl.
CPC .......... *H01L 33/46* (2013.01); *H01L 31/02327* (2013.01); *H01L 31/03044* (2013.01); *H01L 31/18* (2013.01); *H01L 33/32* (2013.01); *H01L 2933/0025* (2013.01)

(58) Field of Classification Search
CPC ... H01L 33/32; H01L 33/46; H01L 31/02327; H01L 31/03044; H01L 31/18; H01L 2933/0025

See application file for complete search history.

(56) References Cited

U.S. PATENT DOCUMENTS

| 6,921,928 B2 | 7/2005 | Sonobe |
| 8,526,476 B2 | 9/2013 | Engl et al. |

(Continued)

FOREIGN PATENT DOCUMENTS

| DE | 102007029370 A1 | 11/2008 |
| DE | 102010009717 A1 | 9/2011 |

(Continued)

OTHER PUBLICATIONS

"Iridium Mineral Data," Mineralogy Database, downloaded date: Nov. 5, 2012, 3 pgs., http://www.webmineral.com/data/Iridium.shtml.

(Continued)

*Primary Examiner* — Armando Rodriguez
(74) *Attorney, Agent, or Firm* — Slater Matsil, LLP

(57) ABSTRACT

A method for manufacturing an optoelectronic semiconductor component and an optoelectronic semiconductor component are disclosed. In an embodiment the component comprises a semiconductor body having a main surface and a mirror region adjoining the main surface of the semiconductor body at least regionally, wherein the minor region has a plurality of domains of a first material composition, the domains being spaced apart from one another and adjoining the main surface, wherein the mirror region comprises a continuous mirror layer of a second material composition, and wherein the mirror layer adjoins the main surface at least regionally between the domains.

15 Claims, 4 Drawing Sheets

(51) Int. Cl.
*H01L 31/0304* (2006.01)
*H01L 31/18* (2006.01)
*H01L 33/32* (2010.01)

(56) References Cited

U.S. PATENT DOCUMENTS

| | | | |
|---|---|---|---|
| 8,648,990 | B2 | 2/2014 | Suzuki |
| 8,872,209 | B2 | 10/2014 | Maute et al. |
| 2008/0246047 | A1 | 10/2008 | Hsu et al. |
| 2010/0012962 | A1* | 1/2010 | Hong ............... H01L 33/46 257/98 |
| 2012/0037930 | A1 | 2/2012 | Höppel |

FOREIGN PATENT DOCUMENTS

| | | |
|---|---|---|
| DE | 102010020211 A1 | 11/2011 |
| JP | 2004071655 A | 3/2004 |
| JP | 2008041866 A | 2/2008 |
| WO | 2010111986 A1 | 10/2010 |
| WO | 2012067075 A1 | 5/2012 |

OTHER PUBLICATIONS

"Platinum Mineral Data," Mineralogy Database, downloaded date: Nov. 5, 2012, 3 pgs., http://www.webmineral.com/data/Platinum.shtml.

"Rhodium Mineral Data," Mineralogy Database, downloaded date: Nov. 5, 2012, 3 pgs., http://www.webmineral.com/data/Rhodium.shtml.

"Silver Mineral Data," Mineralogy Database, downloaded date: Nov. 5, 2012, 3 pgs., http://www.webmineral.com/data/Silver.shtml.

* cited by examiner

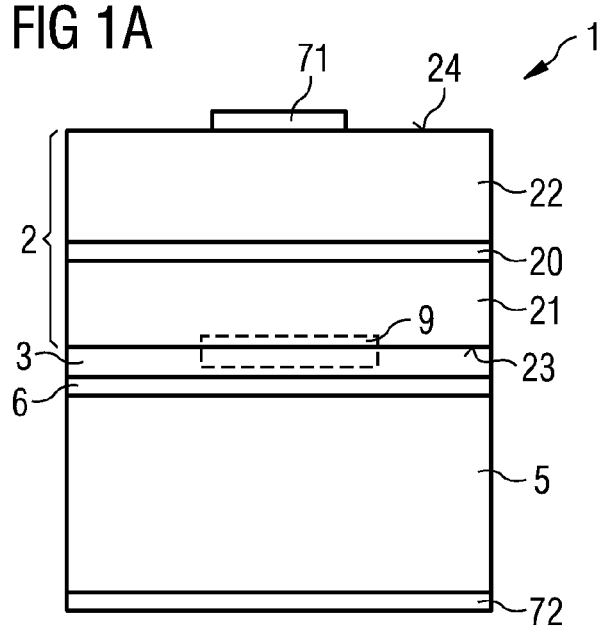
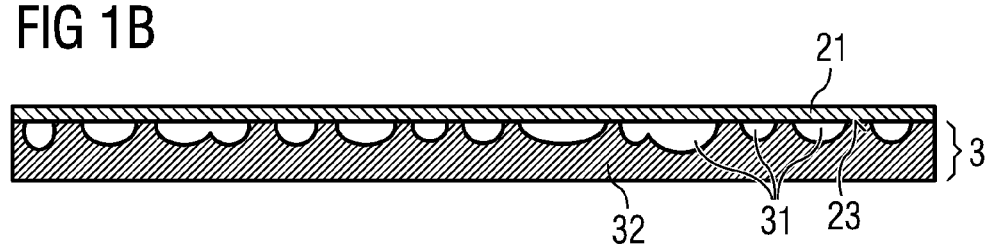
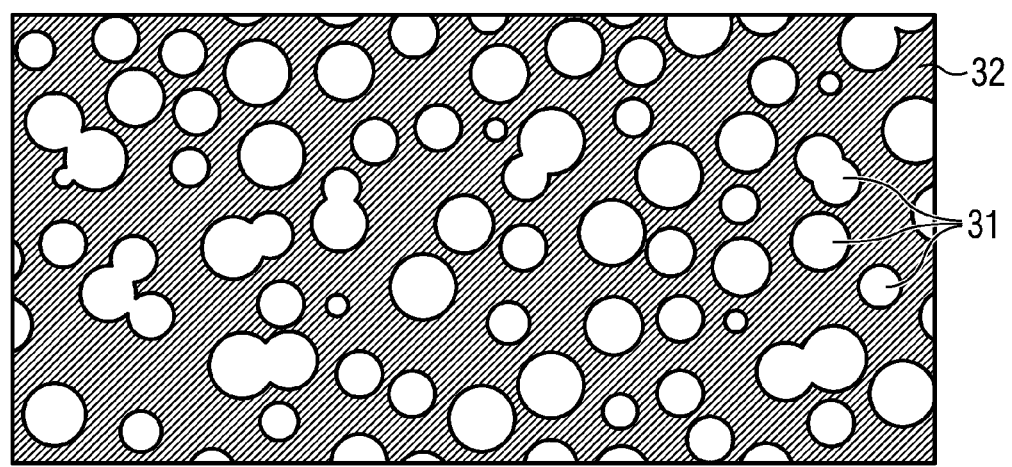

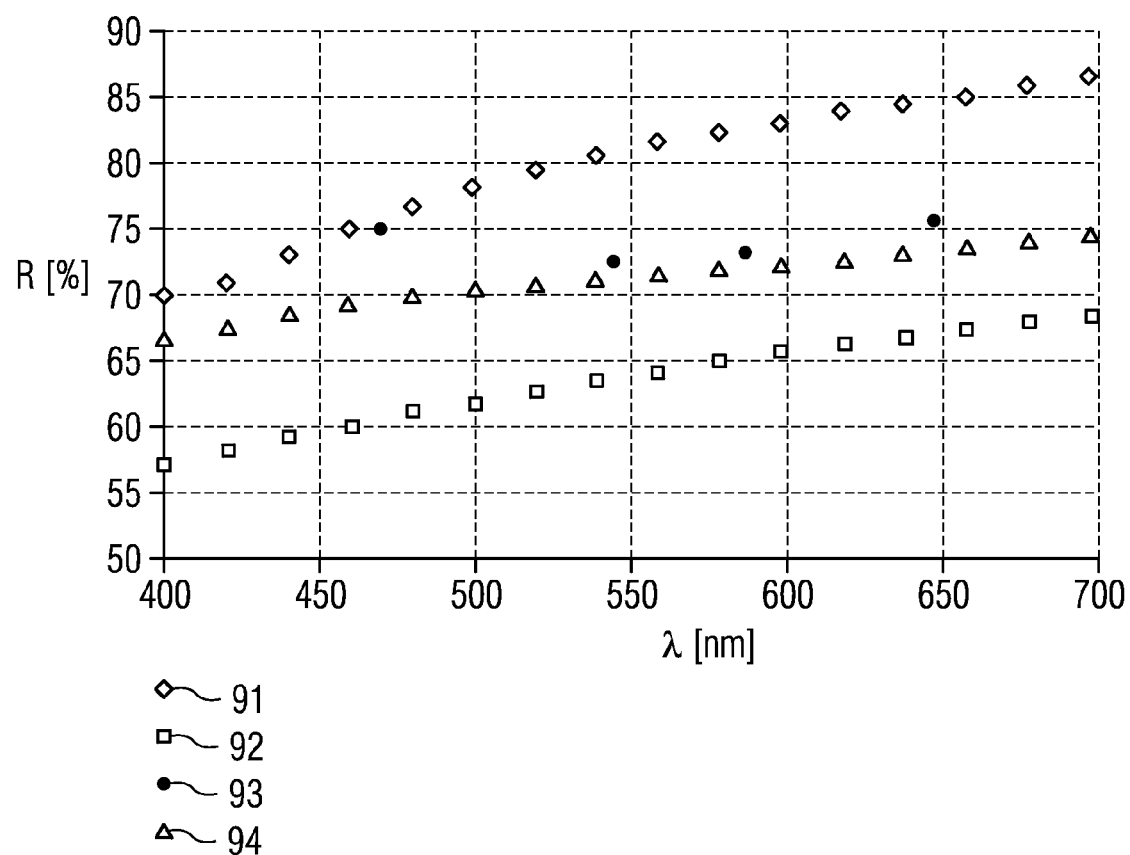

OPTOELECTRONIC SEMICONDUCTOR COMPONENT AND METHOD FOR PRODUCING A MIRROR REGION ON A SEMICONDUCTOR BODY

This patent application is a national phase filing under section 371 of PCT/EP2013/066230, filed Aug. 1, 2013, which claims the priority of German patent application 10 2012 107 384.8, filed Aug. 10, 2012, each of which is incorporated herein by reference in its entirety.

TECHNICAL FIELD

The present application relates to an optoelectronic semiconductor component comprising a semiconductor body and a mirror region, and to a method for producing a mirror region on a semiconductor body.

BACKGROUND

Radiation-emitting semiconductor components such as light-emitting diodes, for example, can comprise minor layers provided for reflecting radiation generated in the semiconductor body. Materials distinguished by a comparatively high reflectivity in the visible spectral range, such as silver, for example, often have only low adhesion to the semiconductor material, however. This can result in detachment of such a mirror layer.

SUMMARY OF THE INVENTION

Embodiments of the invention provide a semiconductor component in which reliable adhesion of the mirror layer in conjunction with high reflectivity can be obtained. Furthermore, embodiments of the invention provide a method by which such a minor layer can be produced.

In accordance with one embodiment, an optoelectronic semiconductor component comprises a semiconductor body and a minor region. The mirror region adjoins a main surface of the semiconductor body at least regionally. The mirror region has a plurality of domains of a first material composition, said domains being spaced apart from one another and adjoining the main surface, and a continuous minor layer of a second material composition. The mirror layer adjoins the main surface at least regionally between the domains.

Improved adhesion of the mirror layer to the semiconductor body can be obtained by means of the domains of the first material composition. The domains therefore serve as adhesion promoters. Therefore, even a material which would exhibit only comparatively low adhesion upon being directly applied to the semiconductor body over the whole area can be used for the minor layer.

A continuous mirror layer is understood to mean, in particular, that at least some regions of the minor layer in which the mirror layer adjoins the main surface between the domains are connected to one another continuously. In other words, between said regions there are paths within the minor layer via which the regions are electrically conductively connected to one another. However, the continuous mirror layer need not completely cover the main surface of the semiconductor body and can be omitted regionally, for example.

The term material composition does not necessarily mean that the domains and/or the mirror layer in each case comprise more than one material. Rather, the domains and/or the minor layer can in each case consist of only one material. However, the domains and/or the minor layer can also comprise more than one material; by way of example, two materials can be mixed with one another, for instance in the form of a metallic alloy, or two materials can be embodied one above another in a layered fashion.

The first material composition and the second material composition differ from one another. Expediently, the material of the domains which adjoins the main surface is chosen with regard to high adhesion to the semiconductor body and the mirror layer is chosen with regard to a high reflectivity for the radiation to be received or to be emitted.

The semiconductor layer sequence can have, for example, an active region provided for generating or for receiving radiation. Expediently, the mirror layer has a high reflectivity, in particular a reflectivity of at least 70% for the radiation that is to be detected or is emitted by the active region during operation. In the visible spectral range and in the ultraviolet spectral range silver, for example, is distinguished by a high reflectivity.

In one preferred configuration, the first material composition is free of platinum. Although platinum is distinguished by the property of good adhesion to semiconductor material, platinum has a comparatively low reflectivity and in addition a comparatively poor electrical conductivity. In principle, however, platinum is also suitable for the first material composition. As a result of the only regional surface occupation of the domains, the reflectivity can be increased compared with a whole-area platinum layer.

In a further preferred configuration, the first material composition contains at least one of the metals from the platinum group metals (PGM), preferably from the platinum group metals apart from platinum. The platinum group metals include, besides platinum ruthenium, rhodium, palladium, iridium and osmium. It has been found that these materials are distinguished by a high adhesion to semiconductor material. Rhodium is particularly suitable on account of its high reflectivity of more than 65% in the visible and ultraviolet spectral range.

In one preferred configuration, the mirror layer in the minor region adjoins the main surface with a surface occupation density of at least 50%, particularly preferably of at least 80%. The greater the surface occupation density of the mirror layer in the mirror region, the closer the reflectivity averaged over the mirror region approaches the reflectivity of the mirror layer.

Preferably, in the entire mirror region at every location either material of the domains or material of the minor layer directly adjoins the main surface. Therefore, a high surface occupation density of the mirror layer is associated with a low surface occupation density of the domains, and vice versa.

Furthermore, the surface occupation density of the minor layer in the mirror region is at most 95%, particularly preferably at most 90%. In other words, the surface occupation density of the domains is at least 5%, particularly preferably at least 10%. A reliable adhesion of the mirror layer to the main surface is thus ensured.

In a further preferred configuration, the domains in a lateral direction, that is to say along the main surface, at least partly have a maximum extent of at most 100 nm, particularly preferably of at most 20 nm. Preferably, the maximum extent of at least 50% of the domains is between 1 nm and 20 nm inclusive. It has been found that, as a result of domains having an extent in the range indicated, a good adhesion can be reconciled particularly well with a high reflectivity.

The domains can be distributed along the main surface over the entire mirror region. Alternatively, the minor region along the main surface can have a microstructuring with domain regions and domain-free regions. That is to say that the domains are formed exclusively in the domain regions. By contrast, the domain-free regions are free of domains. That is to say that the minor layer adjoins the main surface in the domain-free regions of the mirror region, in particular at every location of the domain-free regions of the minor region.

An average maximum lateral extent of the domain regions is preferably at least ten times greater than an average maximum extent of the domains. Therefore, a multiplicity of domains can be formed in a domain region.

The domain regions and the domain-free regions can be arranged alternately in a periodic pattern at least regionally. In particular, the entire minor region can have throughout a microstructuring having a periodic pattern. The domain regions are therefore distributed uniformly over the minor region.

Alternatively, the minor region along the main surface can have an in particular continuous first partial region and an in particular continuous second partial region. Preferably, the first partial region and the second partial region in each case constitute at least 20% of the minor region. A surface occupation of the domain-free regions in the first partial region is greater than that in the second partial region by at least 20%. In particular, the first partial region can be totally free of domain regions.

A surface centroid of the semiconductor body can lie within the first partial region in a plan view of the semiconductor component. In other words, the main surface of the semiconductor body has a central region in which the number of domain regions is reduced compared with an edge region of the main surface or which is totally free of domain regions. In the first partial region, the minor region can be distinguished by a particularly high reflectivity.

That material of the semiconductor body which adjoins the main surface is preferably based on a III-V compound semiconductor material. In particular, the semiconductor material can be based on nitride compound semiconductor material, for example, p-conductively doped nitride semiconductor material. Nitride compound semiconductor material is considered to be semiconductor material which contains nitrogen as group V element. In particular, the semiconductor material can contain $Al_xIn_yGa_{1-x-y}$ where $0 \leq x \leq 1$, $0 \leq y \leq 1$ and $x+y \leq 1$.

For p-conductively doped nitride semiconductor material, domains which contain a metal from the platinum group metals apart from titanium, in particular rhodium, iridium or osmium, and with a minor layer which contains silver have proved to be particularly suitable.

In a method for producing a mirror region on a main surface of a semiconductor body, in accordance with one embodiment, a first material composition is deposited on the main surface with a thickness of preferably at most 5 nm, particularly preferably of at most 1 nm, such that domains of the first material composition form on the main surface. Afterward, a second material composition is deposited on the main surface for forming a continuous mirror layer, wherein the mirror layer adjoins the main surface at least regionally between the domains.

In one preferred configuration, the first material composition is subjected to a heat treatment step before the deposition of the mirror layer such that the average extent of the domains along the main surface decreases.

The heat treatment step is preferably carried out at a temperature of between 50° C. and 500° C. inclusive, particularly preferably between 50° C. and 300° C. inclusive.

A duration of the heat treatment step is preferably between 10 minutes and 5 hours inclusive, particularly preferably between 1 hour and 2 hours inclusive.

In one configurational variant, the main surface is covered regionally by means of a mask before the deposition of the first material composition, such that the first material composition is deposited on the main surface only in the unmasked regions. Preferably, the mask is removed before the deposition of the second material composition, such that the minor layer is formed continuously on the domains and directly adjoins the main surface at least regionally in the regions previously covered by the mask.

The method described is particularly suitable for producing a semiconductor component described further above. Features explained in connection with the semiconductor component can therefore also be used for the method, and vice versa.

BRIEF DESCRIPTION OF THE DRAWINGS

Further features, configurations and expediencies will become apparent from the following description of the exemplary embodiments in conjunction with the figures.

In the figures:

FIGS. 1A to 1C show one exemplary embodiment of a semiconductor component in schematic sectional view (FIG. 1A) with an enlarged illustration of a partial region in FIG. 1B and a schematic illustration of the partial region in plan view (FIG. 1C).

FIG. 5 shows a diagram for the reflectivity R as a function of the wavelength X for various materials.

Figure 2:
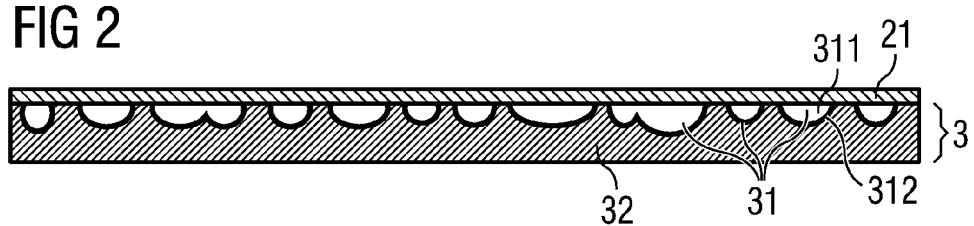
FIG. 2 shows a schematic illustration of an excerpt from a mirror region in schematic sectional view in accordance with a further exemplary embodiment.

Elements that are identical, of identical type or act identically are provided with the same reference signs in the figures.

The figures and the size relationships of the elements illustrated in the figures among one another should not be regarded as to scale. Rather, individual elements and in particular layer thicknesses may be illustrated with an exaggerated size in order to enable better illustration and/or in order to afford a better understanding.

DETAILED DESCRIPTION OF ILLUSTRATIVE EMBODIMENTS

FIG. 1A shows one exemplary embodiment of a semiconductor component 1. The semiconductor component comprises a semiconductor body having a semiconductor layer sequence 2, which forms the semiconductor body. The semiconductor layer sequence comprises an active region 20 provided for generating or receiving radiation, said active region being arranged between a first semiconductor layer 21 of a first conduction type and a second semiconductor layer 22 of a second semiconductor type. By way of example, the first semiconductor layer can be embodied in a p-conducting fashion and the second semiconductor layer in an n-conducting fashion, or vice versa.

The semiconductor component 1 can be embodied, for example, as a luminescence diode, for instance a light emitting diode, or as a radiation receiver, for instance as a photodiode or a phototransistor, in particular in the form of a semiconductor chip.

In a vertical direction, that is to say in a direction running perpendicularly to a main extension plane of the semiconductor layers of the semiconductor layer sequence of the semiconductor body 2, the semiconductor body extends between a main surface 23 and a further main surface 24. A mirror region 3 is arranged on the main surface 23. The mirror region directly adjoins the main surface.

The semiconductor body with the semiconductor layer sequence 2 is fixed to a carrier 5 by means of a connection layer 6.

During the operation of the semiconductor component, charge carriers can be injected into the active region 20 from different sides via a first contact 71 on the further main surface 24 and a second contact 72 arranged on that side of the carrier 5 which faces away from the semiconductor body 2, and can recombine there with emission of radiation. In the case of a radiation receiver, the charge carriers can then be carried away via the contacts from opposite directions. Electrical contact can be made with the semiconductor body 2 through the minor region 3.

In the exemplary embodiment shown, a growth substrate for the semiconductor layer sequence of the semiconductor body 2 has been removed. Such a semiconductor chip is also designated as a thin-film semiconductor chip. The carrier 5 serves for mechanically stabilizing the semiconductor layer sequence such that the growth substrate is no longer required for this purpose.

In a departure from the exemplary embodiment described, the minor region 3 need not cover the entire main surface of the semiconductor body 2.

Furthermore, the minor region 3 described below is suitable, in principle, for all types of semiconductor components in which radiation to be received or to be emitted during operation is intended to be reflected. By way of example, the semiconductor body 2 can also have one or a plurality of cutouts which extend from the main surface 23 through the first semiconductor layer 21 and the active region 20 into the second semiconductor layer and are provided for making electrical contact with the second semiconductor layer 22. An electrical contact on the further main surface 24 can be dispensed with in this case.

Furthermore, the semiconductor component can also be embodied as a flip-chip, for example, in which electrical contact is not made through the carrier formed by the growth substrate, but rather through two contacts on that side of the semiconductor body which faces away from the carrier. In this case, therefore, the minor region 3 can form a part of the first contact 71 or a part of the second contact 72.

An excerpt 9 from the minor region, said excerpt being shown in FIG. 1A, is illustrated schematically in sectional view in FIG. 1B. The minor region 3 has domains 31 of a first material composition and a minor layer 32 of a second material composition. In the region between the domains, the mirror layer 32 adjoins the main surface 31. The domains 31 among one another are at least partly not continuous, such that these in particular are not provided for current transport in a lateral direction.

Preferably, the mirror layer 32 in the mirror region 3 adjoins the main surface 23 with a surface occupation density of at least 50%, particularly preferably of at least 80%.

The extent of the domains 31 in a lateral direction, that is to say along the main surface, is preferably at least for some domains at most 100 nm, particularly preferably at most 20 nm. In a vertical direction running perpendicularly to the main surface, the thickness of the domains is preferably at most 20 nm, particularly preferably at most 10 nm.

For semiconductor material adjoining the main surface 23 and based on p-conductively doped nitride semiconductor material, rhodium has proved to be particularly suitable for the domains 31, and silver for the mirror layer 32. However, alternatively or supplementarily, the domains can also comprise a different material, for example, iridium or osmium or a different metal from the platinum group metals.

The minor layer, too, can alternatively or supplementarily contain a different material, for example, aluminum, nickel or palladium or a metallic alloy comprising at least one of the materials mentioned.

In the entire mirror region 3, either a domain or the mirror layer directly adjoins the main surface 23 at every location. A schematic illustration of the minor region 3 with the domains 31 and the continuous mirror layer 32 is illustrated in plan view in FIG. 1C.

The semiconductor body 2, in particular the active region 20, can also comprise a different semiconductor material, for example, arsenide compound semiconductor material, for instance $Al_xIn_yGa_{1-x-y}As$ or phosphide compound semiconductor material, for instance $Al_xIn_yGa_{1-x-y}P$, in each case where $0 \leq x \leq 1$, $0 \leq y \leq 1$ and $x+y \leq 1$.

FIG. 2 shows a further exemplary embodiment of a minor region 3. In contrast to the exemplary embodiment described with reference to FIG. 1B, the domains 31 each have a first layer 311 and a second layer 312. In this case, the second layer surrounds the first layer in a shell-shaped fashion. Instead of a layered configuration of the domains with two different materials, two different materials can also be deposited jointly in the form of an alloy.

The domains 31 can be distributed along the main surface 23 over the entire minor region 3. A good adhesion of the minor layer by means of the domains as an adhesion promoter is thus ensured over the whole area.

Figure 3A:
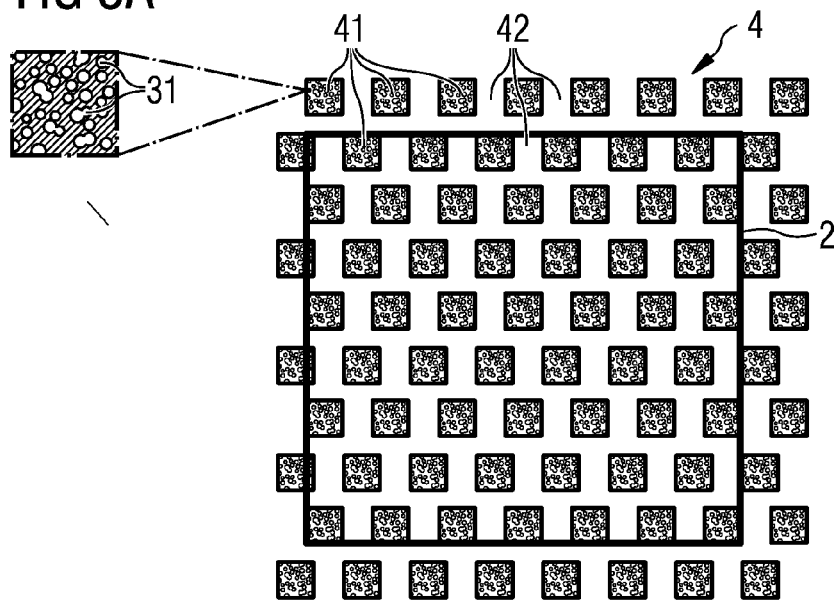
FIGS. 3A and 3B in each case show further exemplary embodiments of a mirror region in schematic plan view.
Figure 3B:
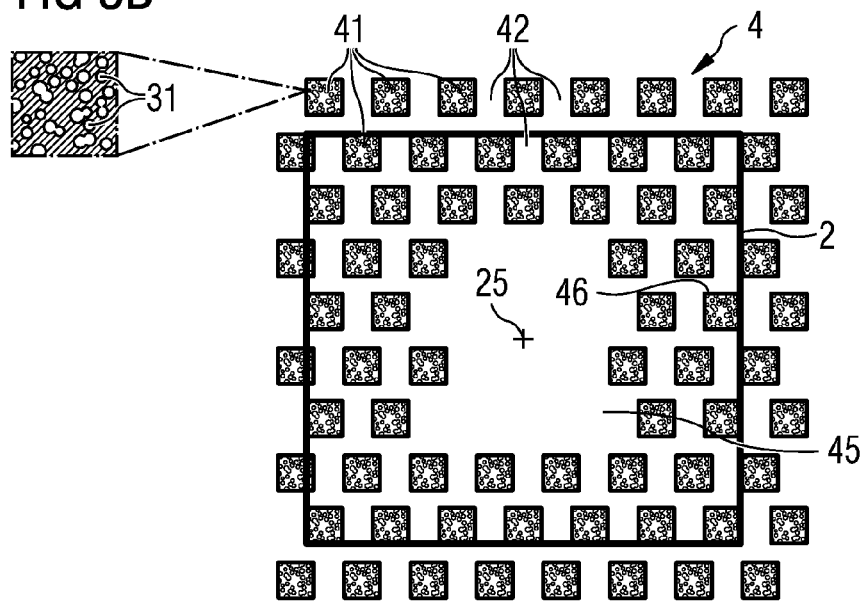

Alternatively, the domains, as shown in FIGS. 3A and 3B, can also be present only regionally.

In the case of the exemplary embodiment illustrated in plan view in FIG. 3A, the minor region 3 has along the main surface 23 a microstructuring 4 having domain regions 41 and domain-free regions 42. In the exemplary embodiment shown, the domain regions and the domain-free regions are formed in a checkered fashion in a periodically alternating sequence. However, the pattern of the structuring is freely variable within wide limits. By way of example, the domain regions 41 can have a round, oval or at least regionally curved basic shape or a polygonal, in particular quadrilateral, for example, rectangular or square, basic shape.

A lateral extent of the domain regions 41 of the microstructuring is preferably at least 10 µm, particularly preferably at least 50 µm. A multiplicity of domains, preferably at least 100 domains, can be formed in each domain region 41.

The domains 31 are formed in each case only in the domain regions 41. Between the domains, the minor layer 32 adjoins the main surface 23 in the domain regions 41. In the domain-free regions 42, by contrast, the mirror layer 32 adjoins the main surface 23 at every location of the minor region 3. The surface occupation density of the mirror layer on the main surface 23 can be increased more extensively by means of the microstructuring 4. The reflectivity averaged over the mirror region is thus increased.

The microstructuring 4 can be formed uniformly over the minor region 3, as shown in FIG. 3A. In particular, the microstructuring 4 in the exemplary embodiment shown can be formed totally independently of the geometry of the semiconductor components emerging from the semiconductor layer sequence. The microstructuring can therefore be formed uniformly over the entire wafer from which the semiconductor components emerge as a result of singulation.

Alternatively, the microstructuring, as shown in FIG. 3B, can have mutually different partial regions having a different microstructuring.

By way of example, the microstructuring can have a first continuous partial region 45, which is free of domain regions 41 or at least has a lower occupation density with domain regions than with a second partial region 46.

In the exemplary embodiment shown, the first partial region 45 is arranged centrally in a plan view of the semiconductor component 1, such that an area centroid 25 of the semiconductor component lies within the first partial region. In the centrally situated central region, the minor region 3 can therefore have a particularly high reflectivity that is determined exclusively by the reflectivity of the mirror layer. The second partial region 46 extends around the first partial region in a frame-shaped fashion in this exemplary embodiment. In this way, the minor region along the edge of the semiconductor component 1 can have an increased density of domain regions. It has been found that the risk of a detachment of the mirror layer 32 from the main surface 23 occurs precisely at the edge. As a result of the different partial regions, a high average reflectivity of the mirror region 3 and a good adhesion can be combined particularly efficiently.

In a departure from the exemplary embodiment described, the first partial region 45 need not necessarily be free of domain regions 41. Preferably, however, a surface occupation of the domain-free regions in the first partial region is greater than that in the second partial region by at least 20%.

In this case, the first partial region 45 and the second partial region 46 are each of a size such that they constitute at least 20% of the minor region 3.

One exemplary embodiment of a method for producing a mirror region is shown schematically on the basis of intermediate steps illustrated in sectional view in each case in FIGS. 4A to 4D, the method being described for the production of a mirror region in which the minor region has a micro structuring as described with reference to FIGS. 3A and 3B.

Figure 4A:
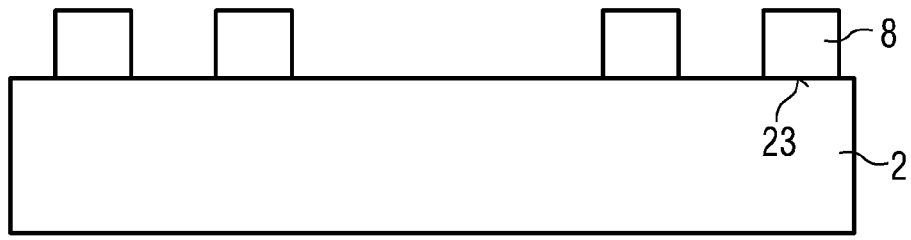
FIGS. 4A to 4D show one exemplary embodiment of a method for producing a minor region on the basis of intermediate steps illustrated schematically in sectional view in each case.

In order to produce the microstructuring 4, as illustrated in FIG. 4A, a mask 8 is positioned on a main surface 23 of a semiconductor body 2. The mask 8 can, for example, be placed onto the main surface or be embodied in the form of a structured photoresist layer on the main surface.

Figure 4B:
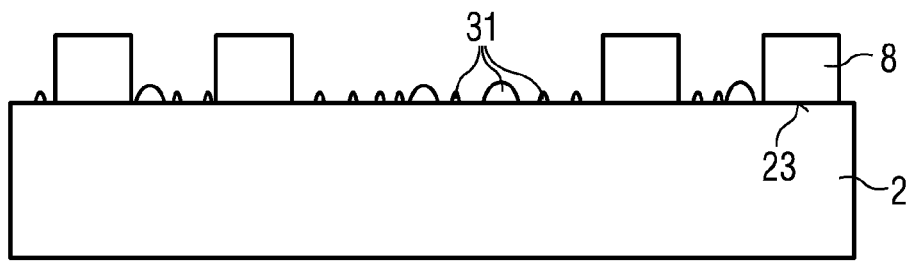

As illustrated in FIG. 4B, domains 31 thus arise only in the unmasked regions of the main surface 23 during the deposition of the first material composition. The domains are formed randomly, such that they vary with regard to the size and the local occupation density.

After the deposition of the first material composition, a heat treatment step can be carried out in order to provide the formation of the domains. The heat treatment step can be carried out under a vacuum or under a protective gas atmosphere. The heat treatment step can be carried out, for example, at a temperature of between 50° C. and 500° C. inclusive, in particular between 50° C. and 300° C. inclusive, for example, over a duration of 1 to 2 hours.

The extent of the domains is illustrated with an exaggerated size in FIG. 4B. The layer thickness of the first material composition is preferably at most 10 nm, particularly preferably at most 5 nm, most preferably at most 1 nm.

Figure 4C:
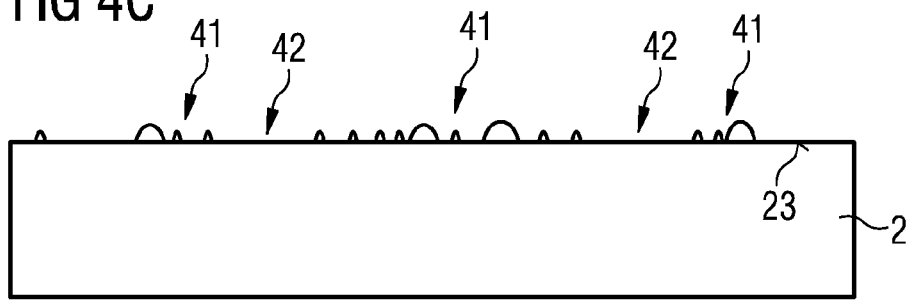
Figure 4D:
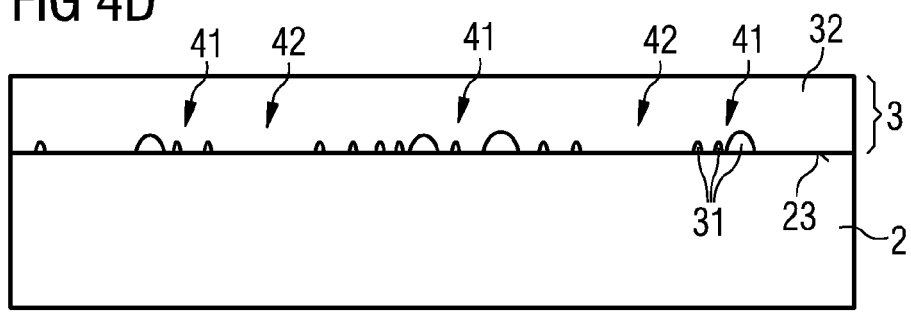

Before the deposition of the mirror layer, the mask 8 is removed, as illustrated in FIG. 4C, such that the mirror layer can be formed continuously, in particular over the whole area, in the mirror region (FIG. 4D).

The deposition of the materials for forming the domains and the deposition of the minor layer are preferably carried out by means of vapor deposition. Alternatively, a PVD (Physical Vapor Deposition) method, for example, sputtering, can also be employed.

FIG. 5 shows the wavelength-dependent reflectivity of the metals silver (curve 91), platinum (curve 92), rhodium (curve 93) and iridium (curve 94). The graph is taken from the source http://webmineral.com/AtoZ/. The illustration shows that of the materials mentioned silver has the highest reflectivity in the ultraviolet and visible spectral range. Rhodium and iridium are furthermore distinguished by a higher reflectivity than platinum and are therefore better suited than platinum. Even with platinum as material for the domains, however, the average reflectivity of the mirror region 3 is increased compared with a whole-area platinum layer as adhesion promoter.

The described configuration of a mirror region 3 with domains composed, for example, of rhodium, iridium or a different metal from the platinum group metals in conjunction with a mirror layer composed of silver, therefore makes it possible to obtain a particularly high reflectivity of the mirror region 3 with at the same time good adhesion of the mirror layer.

The invention is not restricted by the description on the basis of the exemplary embodiments. Rather, the invention encompasses any novel feature and also any combination of features, even if this feature or this combination of features itself is not explicitly specified in the patent claims or the exemplary embodiments.

The invention claimed is:

1. An optoelectronic semiconductor component, comprising:
   a semiconductor body having a main surface; and
   a mirror region adjoining the main surface of the semiconductor body at least regionally, wherein the mirror region has a plurality of domains of a first material composition, the domains being spaced apart from one another and adjoining the main surface, wherein the mirror region comprises a continuous mirror layer of a second material composition, and wherein the mirror layer adjoins the main surface at least regionally between the domains;
   wherein a material of the semiconductor body which adjoins the main surface is based on p-conductively doped nitride semiconductor material;
   wherein the first material composition comprises one or more materials selected from the group consisting of rhodium, iridium and osmium;
   wherein the domains along the main surface at least partly have a maximum extent of at most 100 nm; and
   wherein the mirror layer contains silver.

2. The optoelectronic semiconductor component according to claim 1, wherein the first material composition contains a metal from the platinum group metals.

3. The optoelectronic semiconductor component according to claim 1, wherein the first material composition is selected from the group consisting of ruthenium, rhodium, palladium, iridium and osmium.

4. The optoelectronic semiconductor component according to claim 1, wherein the mirror layer in the mirror region adjoins the main surface with a surface occupation density of at least 50%.

5. The optoelectronic semiconductor component according to claim 1, wherein the mirror layer in the mirror region adjoins the main surface with a surface occupation density of at least 80%.

6. The optoelectronic semiconductor component according to claim 1, wherein the domains along the main surface at least partly have a maximum extent of at most 100 nm.

7. The optoelectronic semiconductor component according to claim 1, wherein the mirror region along the main surface has a micro-structuring with domain regions and domain-free regions.

8. The optoelectronic semiconductor component according to claim 7, wherein the domain regions and the domain-free regions are arranged alternately in a periodic pattern at least regionally.

9. The optoelectronic semiconductor component according to claim 7, wherein the mirror region along the main surface has a continuous first partial region and a continuous second partial region,
- wherein the first partial region and the second partial region in each case constitute at least 20% of the mirror region, and
- wherein a surface occupation of the domain-free regions in the first partial region is greater than that in the second partial region by at least 20%.

10. The optoelectronic semiconductor component according to claim 9, wherein a surface centroid of the semiconductor body lies within the first partial region in a plan view of the optoelectronic semiconductor component.

11. A method comprising:
- providing a semiconductor body, the semiconductor body having a main surface;
- depositing a first material composition on the main surface with a thickness of at most 5 nm, such that domains of the first material composition form on the main surface;
- subjecting the first material composition to a heat treatment such that an average extent of the domains along the main surface decreases; and
- depositing a second material composition on the main surface after subjecting the first material composition to a heat treatment, thereby forming a continuous mirror layer which adjoins the main surface at least regionally between the domains.

12. The method according to claim 11, further comprising:
- forming a mask on the main surface before depositing the first material composition such that the first material composition is deposited on the main surface only in the unmasked regions; and
- removing the mask before depositing the second material composition.

13. An optoelectronic semiconductor component, comprising:
- a semiconductor body having a main surface; and
- a mirror region adjoining the main surface of the semiconductor body at least regionally, wherein the mirror region has a plurality of domains of a first material composition, the domains being spaced apart from one another and adjoining the main surface, wherein the mirror region comprises a continuous mirror layer of a second material composition, and wherein the mirror layer adjoins the main surface at least regionally between the domains;
- wherein the mirror region along the main surface has a micro-structuring with domain regions and domain-free regions; and
- wherein the mirror region along the main surface has a continuous first partial region and a continuous second partial region;
- wherein the first partial region and the second partial region each constitute at least 20% of the mirror region; and
- wherein a surface occupation of the domain-free regions in the first partial region is greater than a surface occupation of the domain-free regions in the second partial region by at least 20%.

14. The optoelectronic semiconductor component according to claim 13, wherein a maximum extent of the plurality of domains in a direction along the main surface is, at least for some of the plurality of domains, at most 20 nm.

15. The optoelectronic semiconductor component according to claim 13, wherein a surface centroid of the semiconductor body lies within the first partial region in a plan view of the semiconductor component.

* * * * *